United States Patent
Wakabayashi (10) Patent No.: US 9,887,115 B2
(45) Date of Patent: Feb. 6, 2018

(54) SUBSTRATE PROCESSING APPARATUS, COVER OPENING AND CLOSING MECHANISM, SHIELDING MECHANISM, AND METHOD FOR PURGING CONTAINER

(71) Applicant: Tokyo Electron Limited, Tokyo (JP)

(72) Inventor: Shinji Wakabayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 299 days.

(21) Appl. No.: 14/646,706

(22) PCT Filed: Nov. 12, 2013

(86) PCT No.: PCT/JP2013/080969
§ 371 (c)(1),
(2) Date: May 21, 2015

(87) PCT Pub. No.: WO2014/080851
PCT Pub. Date: May 30, 2014

(65) Prior Publication Data
US 2015/0340259 A1 Nov. 26, 2015

(30) Foreign Application Priority Data
Nov. 22, 2012 (JP) ................................ 2012-256778

(51) Int. Cl.
*H01L 21/677* (2006.01)
*H01L 21/673* (2006.01)

(52) U.S. Cl.
CPC .... *H01L 21/67376* (2013.01); *H01L 21/6773* (2013.01); *H01L 21/67373* (2013.01); *H01L 21/67393* (2013.01); *H01L 21/67772* (2013.01)

(58) Field of Classification Search
CPC ......... H01L 21/67373; H01L 21/67376; H01L 21/67379; H01L 21/67393; H01L 21/6773; H01L 21/67772; H01L 21/67775
(Continued)

(56) References Cited

U.S. PATENT DOCUMENTS

| 6,053,688 A * | 4/2000 | Cheng ............... H01L 21/67772 118/719 |
| 2002/0006322 A1* | 1/2002 | Perlov ............... H01L 21/67196 414/217 |

(Continued)

FOREIGN PATENT DOCUMENTS

| JP | 2003-45933 | 2/2003 |
| JP | 2008-251627 A | 10/2008 |

(Continued)

OTHER PUBLICATIONS

International Search Report dated Jan. 21, 2014; International Application No. PCT/JP2013/080969.

*Primary Examiner* — Anna M Momper
*Assistant Examiner* — Brendan P Tighe (57) ABSTRACT

Provided is a substrate processing apparatus that can suppress the amount of inert gas and dry gas used and also can prevent reductions in throughput. A substrate processing apparatus is provided with: a loader module; an opener that removes a cover from a FOUP having a main body, an opening and the cover, to communicate the inside of the FOUP with the inside of the loader module through the opening; an $N_2$ gas supply unit that is attached to the loader module and supplies $N_2$ gas to the inside of the FOUP; and two slide cover plates movable respectively along an opening surface of the opening. The slide cover plates move toward each other until the gap therebetween is 1 mm to 3

(Continued)

mm to shield the opening of the FOUP that is attached to the loader module from the inside of the loader module.

21 Claims, 7 Drawing Sheets

(58) Field of Classification Search
USPC ........ 414/217, 217.1, 222.01, 806, 937, 939
See application file for complete search history.

(56) References Cited

U.S. PATENT DOCUMENTS

| | | |
|---|---|---|
| 2003/0031537 A1 | 2/2003 | Tokunaga |
| 2004/0152322 A1 | 8/2004 | Tokunaga |
| 2008/0031708 A1* | 2/2008 | Bonora ............. H01L 21/67772 414/217 |
| 2008/0031709 A1* | 2/2008 | Bonora ............. H01L 21/67772 414/217 |
| 2013/0000757 A1* | 1/2013 | Yoshimura ........ H01L 21/67772 137/561 R |
| 2014/0064885 A1* | 3/2014 | Oyama ............. H01L 21/67373 414/160 |
| 2014/0305540 A1* | 10/2014 | Oyama ............. H01L 21/67389 141/4 |
| 2017/0125272 A1* | 5/2017 | van Gogh ......... H01L 21/67393 |
| 2017/0178942 A1* | 6/2017 | Sakata ............. H01L 21/67778 |

FOREIGN PATENT DOCUMENTS

| | | |
|---|---|---|
| JP | 2011-159834 | 8/2011 |
| KR | 10-2004-0069991 A | 8/2004 |
| WO | 2010/007657 | 1/2010 |

\* cited by examiner

SUBSTRATE PROCESSING APPARATUS, COVER OPENING AND CLOSING MECHANISM, SHIELDING MECHANISM, AND METHOD FOR PURGING CONTAINER

CROSS REFERENCE

This patent application is a national stage of PCT Application No. PCT/JP2013/080969, filed on Nov. 12, 2013, which claims priority to and benefit of Japanese Patent Application No. 2012-256778, filed on Nov. 22, 2012. The foregoing patent applications are incorporated by reference for all purposes by their entirety.

FIELD OF THE INVENTION

The present invention relates to a substrate processing apparatus using a container that accommodates a plurality of substrates and has an opening and a cover for covering the opening, a cover opening and closing mechanism, a shielding mechanism and a method for purging the container.

BACKGROUND OF THE INVENTION

A semiconductor wafer (hereinafter, simply referred to as "wafer") as a substrate is transferred while being accommodated in an airtight container in order to prevent dirt or the like in the air from being adhered thereto. As for such a container, there is used a FOUP (Front Opening Unified Pod) specified by SEMI (Semiconductor Equipment and Material Institute) Standards. The FOUP is a box-shaped container configured to accommodate therein a plurality of wafers. The FOUP includes a housing-shaped main body having an opening at one surface thereof and a cover for covering the opening of the housing-shaped main body.

Generally, in a substrate processing apparatus for performing predetermined processing, e.g., plasma processing, the FOUP is installed at a transfer chamber or the like of the substrate processing apparatus and a wafer accommodated therein is unloaded after the cover of the FOUP is opened. A wafer subjected to the plasma processing is returned to the FOUP.

In this case, a reaction by-product may be adhered to the wafer subjected to the plasma processing. If the wafer to which the reaction by-product is adhered is accommodated in the FOUP, an acid gas may be generated due to chemical reaction between the reaction by-product and moisture in the air inside the FOUP or between a volatile gas generated by volatilization of the reaction by-product and moisture in the air inside the FOUP. The acid gas causes an adverse effect, such as abnormal oxidization of a wiring of the wafer subjected to the plasma processing or the like, on the wafer. Further, ammonia ($NH_3$) in a clean room may enter the FOUP and generate a reaction by-product, e.g., ammonium fluoride or ammonium bromide, due to reaction with the acid gas. In that case, the generated reaction by-product is adhered to an unprocessed wafer and contaminates it.

To cope with that, there is suggested a technique for removing moisture or a volatile gas from the inside of the FOUP. For example, there is suggested a method for removing, by ejection, moisture or a volatile gas from the inside of the FOUP by supplying, when the FOUP is attached to the transfer chamber or the like and the cover is removed, an inert gas or a dry gas toward the opening of the main body from a gas supply port provided at the outside of the FOUP (see, e.g., Japanese Patent Application Publication No. 2003-45933).

Since, however, the opening of the main body of the FOUP is in an open state during the supply of the inert gas or the like, it is difficult for the supplied inert gas or the like to remain inside the main body. Accordingly, the amount of the inert gas or the like used is increased.

Even after all the wafers that have been subjected to the plasma processing are accommodated in the main body and the opening is closed by attaching the cover to the main body, the concentration of moisture in the main body needs to be decreased to a certain level by supplying the inert gas or the like thereinto. However, in the method disclosed in Japanese Patent Application Publication No. 2003-45933, it is difficult to maintain the concentration of the inert gas or the like in the main body, because the supplied inert gas or the like does not remain in the main body. Accordingly, time is required to decrease the concentration of moisture in the main body after the opening is closed, and a throughput is decreased.

SUMMARY OF THE INVENTION

In view of the above, the present invention provides a substrate processing apparatus capable of reducing the amount of an inert gas or a dry gas used and preventing a decrease of a throughput, a cover opening and closing mechanism, a shielding mechanism and a method for purging the container.

In accordance with the present invention, there is provided a substrate processing apparatus which includes a substrate transfer chamber, a cover opening and closing mechanism configured to communicate an inside of a container, which accommodates a plurality of wafers and has an opening and a cover for blocking the opening, with an inside of the substrate transfer chamber through the opening when the container is attached to the substrate transfer chamber and the cover of the container is removed, and a purge gas supply unit configured to supply an inert gas or a dry gas into the container attached to the substrate transfer chamber, the apparatus including a shielding mechanism configured to isolate the opening of the container attached to the substrate transfer chamber from the inside of the substrate transfer chamber, wherein the shielding mechanism has two slide cover plates respectively movable along an opening surface of the opening.

In accordance with the present invention, there is a cover opening and closing mechanism configured to, when a container, which accommodates a plurality of substrates and has an opening and a cover for blocking the opening, is attached to the substrate transfer chamber, communicate an inside of the container with an inside of the substrate transfer chamber through the opening by removing the cover of the container, the mechanism including a shielding mechanism configured to shield the opening of the container attached to the substrate transfer chamber from the inside of the substrate transfer chamber, wherein the shielding mechanism includes two slide cover plates respectively movable along an opening surface of the opening, and wherein, when an inert gas or a dry gas is supplied into the container attached to the substrate transfer chamber, the two slide cover plates are moved toward each other and shield the opening of the container from the inside of the substrate transfer chamber.

In the present invention, the two slide cover plates may be moved toward each other until a gap therebetween becomes about 1 mm to 3 mm.

In accordance with the present invention, there is provided a shielding mechanism provided in a substrate transfer chamber to which a container is to be attached, the container accommodating a plurality of substrates and having an opening and a cover for blocking the opening, the mechanism including two slide cover plates movable respectively along an opening surface of the opening when the container is attached to the substrate transfer chamber and the cover is removed from the container to communicate an inside of the container communicates with an inside of the substrate transfer chamber through the opening, wherein, when an inert gas or a dry gas is supplied into the container attached to the substrate transfer chamber, the two slide cover plates move toward each other and shield the opening of the container from the inside of the substrate transfer chamber.

In the present invention, the two slide cover plates may be moved toward each other until a gap therebetween becomes about 1 mm to 3 mm.

In accordance with the present invention, there is provided a method for purging a container attached to a substrate transfer chamber, the container accommodating a plurality of substrates and having an opening and a cover for blocking the opening, the method including attaching the container to the substrate transfer chamber, communicating an inside of the container with an inside of the substrate transfer chamber by removing the cover of the container attached to the substrate transfer chamber, supplying an inert gas or a dry gas into the container, moving two slide cover plates toward each other along an opening surface of the opening to shield the opening of the container from the inside of the substrate transfer chamber, and moving the two slide cover plates away from each other to form a substrate unloading gap between the two slide cover plates at a position corresponding to a position of a substrate to be unloaded when the substrate is unloaded from the container.

In the present invention, it is preferred that the two slide cover plates are moved toward each other until a gap therebetween becomes about 1 mm to 3 mm.

In the present invention, it is preferred that the substrate unloading gap is about 20 mm to 50 mm.

In the present invention, the method may further include, when another substrate is unloaded from the container, moving the two slide cover plates away from each other to form the substrate unloading gap at a position corresponding to a position of the another substrate to be unloaded.

In the present invention, while the two slide cover plates are being moved away from each other, the inert gas or the dry gas may be supplied into the container.

Effect of the Invention

With the present invention, the two plate-shaped movable covers of the shielding mechanism are respectively movable along the opening surface of the opening of the container which is attached to the substrate transfer chamber and whose cover is removed. Therefore, when the two slide cover plates move toward each other, the opening of the container can be shielded. Meanwhile, when a substrate is unloaded from the container, the two slide cover plates are moved away from each other to form a substrate unloading gap at a position corresponding to a position of a substrate to be unloaded. Accordingly, the substrate can be unloaded through the substrate unloading gap without fully opening the opening. As a result, it is possible to prevent a large amount of the inert gas or the dry gas supplied into the container from being leaked through the opening.

The present invention can prevent a large amount of the inert gas or the dry gas supplied into the container from being leaked through the opening and can easily maintain the concentration of the inert gas or the dry gas in the container. Therefore, it is possible to rapidly complete the supply of the inert gas or the dry gas which is required to decrease the concentration of moisture in the container after the cover is fitted into the opening of the container. As a result, the decrease of the throughput can be avoided.

DETAILED DESCRIPTION OF THE EMBODIMENTS

Hereinafter, embodiments will be described with reference to the accompanying drawings.

Figure 1:
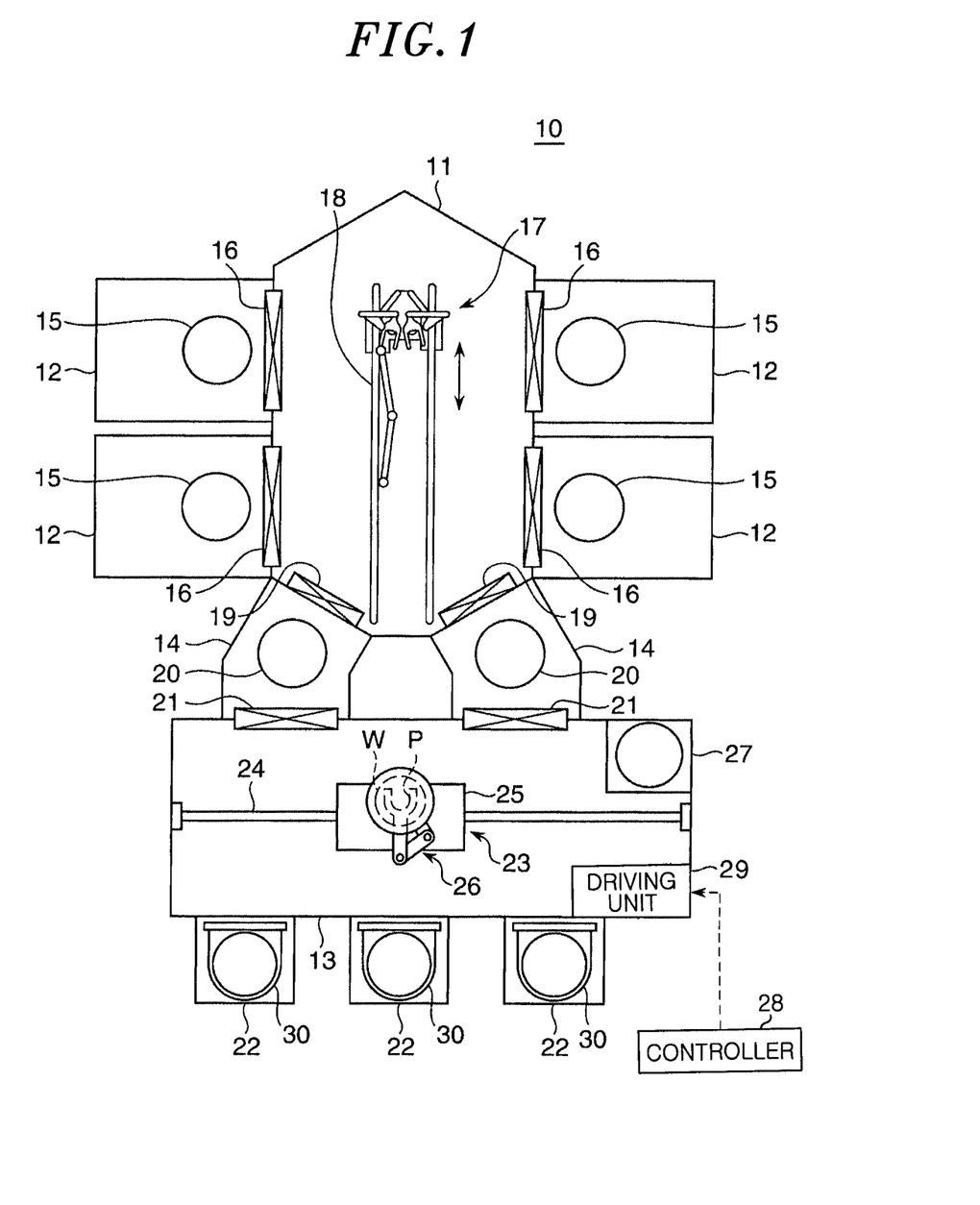
FIG. 1 is a top view schematically showing a configuration of a substrate processing apparatus according to an embodiment of the present invention.

FIG. 1 is a top view schematically showing a configuration of a substrate processing apparatus according to an embodiment of the present invention. In FIG. 1, the interior of the substrate processing apparatus is shown for ease of explanation. The substrate processing apparatus shown in FIG. 1 is configured to perform plasma processing on one wafer at a time.

Referring to FIG. 1, a substrate processing apparatus 10 includes: a transfer module 11 having a substantially hexagonal shape when seen from the top; four process modules 12 disposed at both side surfaces of the transfer module 11; a loader module 13 (substrate transfer chamber) disposed opposite to the transfer module 11; and two load-lock modules 14 provided between the transfer module 11 and the loader module 13.

Each of the process modules 12 is configured as a vacuum processing chamber in which a stage 15 is provided. After a wafer W is mounted on the stage 15, a pressure in the chamber is decreased and a processing gas is introduced thereinto. A high frequency power is applied to generate plasma and the wafer W is subjected to plasma processing by the plasma thus generated. Each of the process modules 12 and the transfer module 11 are partitioned by an openable gate valve 16.

The transfer module 11 is configured as a vacuum processing chamber in which a transfer arm unit 17 having two SCARA-type transfer arms is provided. The transfer arm unit 17 moves along a guide rail 18 provided in the transfer module 11 to transfer the wafer to each of the process modules 12 or to each of the load-lock modules 14. Each of the load-lock modules 14 and the transfer module 11 are partitioned by an openable gate valve 19.

Each of the load-lock modules 14 is configured as a pressure variable chamber of which interior can be switched between a vacuum state and an atmospheric pressure state. A stage 20 is provided in each of the load-lock modules 14. Each of the load-lock modules 14 and the loader module 13 are partitioned by an openable gate valve 21.

In each of the load-lock modules 14, when the wafer W is transferred from the loader module 13 into the transfer module 11, a pressure in the loader module 13 is first maintained at an atmospheric pressure level and, then, the gate valve 21 is opened. Next, the wafer W is transferred from the loader module 13 and mounted on the stage 20. Thereafter, the gate valve 21 is closed and a pressure in the load-lock module 14 is decreased to a vacuum level. Then, the gate valve 19 is opened and the wafer W is loaded into the transfer module 11. When the wafer W is transferred from the transfer module 11 into the loader module 13, a pressure in the load-lock modules 14 is first maintained at the vacuum level and, then, the gate valve 19 is opened. Next, the wafer W is unloaded from the transfer module 11 and mounted on the stage 20. Thereafter, the gate valve 19 is closed and a pressure in the load-lock module 14 is increased to the atmospheric pressure level. Then, the gate valve 21 is opened and the wafer W is transferred into the loader module 13.

The loader module 13 is configured as a rectangular parallelepiped shaped atmospheric transfer chamber. Each of the load-lock modules 14 is connected to one longitudinal surface of the loader module 13 and three FOUP mounting tables 22 are provided at the other longitudinal surface of the loader module 13.

A transfer unit 23 is provided in the loader module 13. The transfer unit 23 includes a guide rail 24, a supporting table 25, and a SCARA type transfer arm 26. The guide rail 24 is disposed along the longitudinal direction of the loader module 13. The supporting table 25 supports the transfer arm 26 and moves along the guide rail 24. The transfer arm 26 is configured to be rotatable, extensible and contractible. A pick P for supporting the wafer W is provided at a leading end of the transfer arm 26.

The loader module 13 has an orienter 27 for aligning a relative position (e.g., a relative position with respect to the pick P or the stages 15 and 20) of the wafer W unloaded from a FOUP 30 which is mounted on the FOUP mounting table 22 and attached to the loader module 13. The loader module 13 includes a driving unit 29 for driving a shielding mechanism 43, 44 and an opener 42 to be described later. The driving unit 29 may move the shielding mechanism along an opening surface of an opening 33 of the FOUP 30 to be described later.

In the loader module 13, the transfer unit 23 transfers the wafer W among each of the FOUPs 30, each of the load-lock modules 14 and the orienter 27.

The substrate processing apparatus 10 includes a controller 28 that is, e.g., a computer. The operation of each component (e.g., the transfer module 11 or the process module 12) of the substrate processing apparatus 10 is controlled by the controller 28.

Figure 2:
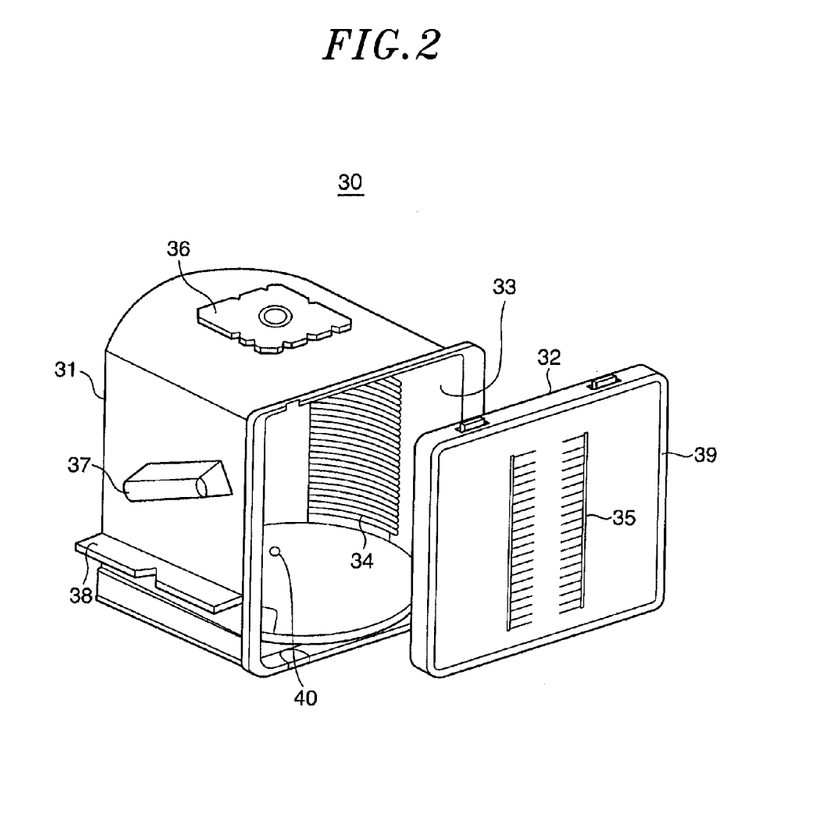
FIG. 2 is a perspective view schematically showing a configuration of a FOUP that is attached to a loader module while being mounted on a FOUP mounting table shown in FIG. 1.

FIG. 2 is a perspective view schematically showing a configuration of the FOUP 30, which is mounted on the FOUP mounting table and attached to the loader module 13, shown in FIG. 1. In FIG. 2, for explanation, there is illustrated the state in which a main body 31 and a cover 32 of the FOUP 30 are separated from each other and an inner surface of the cover 32 is disposed to face outward. However, normally, the cover 32 is fitted into the opening 33 of the main body 31 and the main body 31 and the cover 32 are moved as one unit during the transfer of the FOUP 30.

In FIG. 2, the FOUP 30 includes a substantially cubic-shaped main body 31 and a substantially rectangular flat plate-shaped cover 32. The main body 31 and the cover 32 are made of, e.g., high-performance plastics. The main body 31 has the opening 33 at one side surface thereof. The cover 32 is fitted into the opening 33.

The main body 31 has wafer teeth 34 that are a plurality of shelf-shaped protrusions formed horizontally at an inner side surface thereof. The cover 32 has retainers 35 that are a plurality of shelf-shaped protrusions formed horizontally at the inner surface thereof. When a plurality of wafers W is accommodated in the FOUP 30, a single wafer W is horizontally held by each of the wafer teeth 34 and each of the retainers 35.

The main body 31 further has a robot flange 36 and a manual handle 37 which are provided at an outer surface thereof, and side rails 38 for transferring the FOUP 30 along a guide provided in a clean room or the like. The cover 32 has a seal member 39 provided on its edge portion coming into contact with the main body 31. The seal member 39 is made of, e.g., a rubber material. When the cover 32 is fitted into the opening 33 of the main body 31, the seal member 39 fills a gap between the cover 32 and the main body 31, thereby sealing the inside of the FOUP 30 from the outside.

The FOUP 30 has a gas supply port 40 at the bottom portion of the main body 31. The gas supply port 40 has a one-way mechanism, for example, and is configured to supply a gas from the outside only when an external pressure is higher than a pressure in the FOUP 30.

Referring back to FIG. 1, in the substrate processing apparatus 10, when the plasma processing is performed on each of the wafers W accommodated in the FOUP 30, the FOUP 30 is first mounted on the FOUP mounting table 22. Then, the cover 32 of the FOUP 30 is removed, so that the inside of the FOUP 30 communicates with the inside of the loader module 13 through the opening 33. Next, the transfer unit 23 takes out one wafer W at a time from each of the FOUPs 30 and transfers it to the orienter 27. Further, the transfer unit 23 loads the wafer W whose relative position has been aligned into the load-lock module 14. Thereafter, the transfer arm unit 17 of the transfer module 11 receives the wafer W from the load-lock module 14 and loads it into one of the process modules 12. Then, the transfer arm unit 17 receives a wafer W subjected to the plasma processing from the process module 12 and transfers it into the load-lock module 14. Next, the transfer unit 23 receives the wafer W from the load-lock module 14 and transfers it into one of the FOUPs 30.

Figure 3:
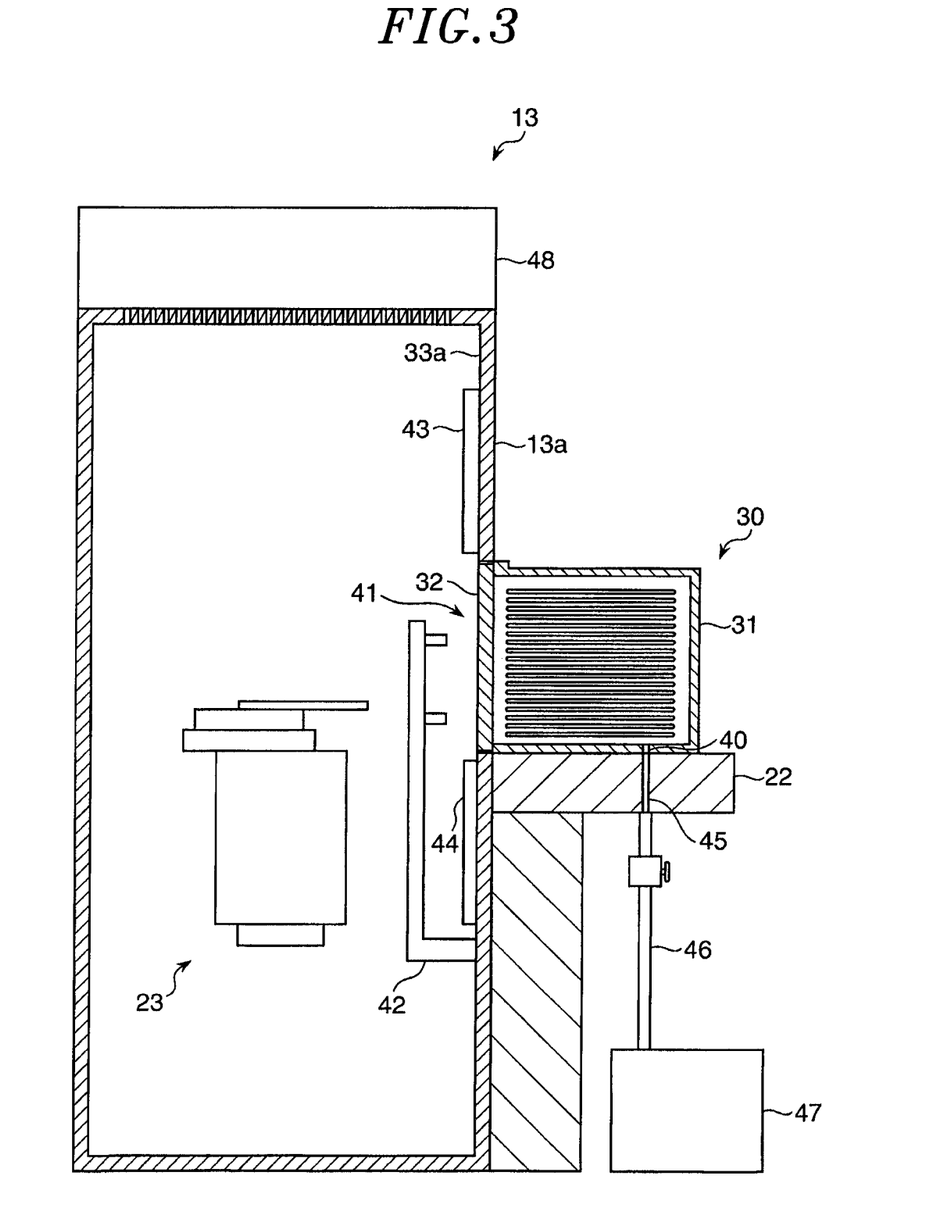
FIG. 3 is a cross sectional view schematically showing a configuration of the loader module shown in FIG. 1.

FIG. 3 is a cross sectional view schematically showing a configuration of the loader module shown in FIG. 1. In FIG. 3, the load-lock modules 14 are omitted.

Referring to FIG. 3, the loader module 13 includes: a FOUP attachment opening 41 that is opened above the FOUP mounting table 22 at a side wall 13a where the FOUP mounting table 22 is provided; an opener 42 configured as an L-shaped arm provided at an inner side of the side wall 13a; slide cover plates 43 and 44 (shielding mechanism) that are respectively provided above and below the FOUP attachment opening 41 at the inner side of the side wall 13a; an $N_2$ gas supply path 45 that is opened at the top surface of the FOUP mounting table 22 to communicate with the gas supply port 40 of the FOUP 30 when the FOUP 30 is mounted on the FOUP mounting table 22; an $N_2$ gas supply unit 47 (an inert gas supply unit) communicating with the gas supply port 40 through the N₂ gas supply path 45 and a pipe 46; and a fan filter unit 48 provided on the top portion of the loader module 13.

The FOUP attachment opening 41 has a size that allows the cover 32 of the FOUP 30 to be fitted. When the FOUP 30 is attached to the loader module 13, the cover 32 of the FOUP 30 is fitted into the FOUP attachment opening 41. When the FOUP 30 is not attached to the loader module 13, the FOUP attachment opening 41 is blocked by a shutter (not shown).

The controller 28 controls operations of the opener 42 and the slide cover plates 43, 44 through the driving unit 29. Specifically, the opener 42 is movable within a predetermined range in a vertical direction and in a horizontal direction in FIG. 3. The opener 42 is coupled to the cover 32 of the FOUP 30 attached to the loader module 13 to remove the cover 32. The N₂ gas supply unit 47 supplies N₂ gas into the FOUP 30 through the pipe 46, the N₂ gas supply path 45 and the gas supply port 40.

The fan filter unit 48 has therein a fan (not shown) and generates a downflow directed from an upper space to a lower space inside the loader module 13. Particles or the like floating in the loader module 13 are carried by the downflow and discharged to the outside of the loader module 13.

The slide cover plates 43 and 44 are configured to be respectively movable in the vertical direction in FIG. 3 to the FOUP attachment opening 41 along the inner side of the side wall 13a. Further, the slide cover plates 43 and 44 move along the opening surface of the opening 33, which is parallel to the inner side of the side wall 13a, in front of the FOUP attachment opening 41. The slide cover plates 43 and 44 may move toward each other in front of the FOUP attachment opening 41 until a gap therebetween becomes about 1 mm to 3 mm. Accordingly, the opening 33 of the FOUP 30 is shielded from the inside of the loader module 13. Further, a gap may be formed at any position by moving the slide cover plates 43 and 44 away from each other in front of the FOUP attachment opening 41. A part of the opening 33 is exposed to the inside of the loader module 13 through the gap between the slide cover plates 43 and 44.

The slide cover plates 43 and 44 may not be in close contact with the inner side of the side wall 13a. That is, a fine gap, e.g., a gap ranging from about 1 mm to 5 mm, may be formed between the slide cover plates 43 and 44 and the inner side of the side wall 13a. Accordingly, even after the slide cover plates 43 and 44 shield the opening 33 from the inside of the loader module 13, the inside of the FOUP 30 communicates with the inside of the loader module 13 through the fine gap. Therefore, moisture or a volatile gas in the FOUP 30 can be discharged into the loader module 13 through the fine gap when the N₂ gas is supplied into the FOUP 30. As a result, the inside of the FOUP 30 can become clean and dry rapidly.

In the present embodiment, the opener 42, the slide cover plates 43 and 44, and the shutter for the FOUP attachment opening 41 constitute a load port (a cover opening and closing mechanism).

FIGS. 4A to 4C and 5A to 5C are process charts showing a method for purging a container according to the present embodiment.

The FOUP 30 is first mounted on the FOUP mounting table 22. Then, the FOUP 30 is attached to the loader module 13 by fitting the cover 32 into the FOUP attachment opening 41. Next, the opener 42 is moved upward and rightward and coupled to the cover 32 (see FIG. 4A). At this time, the N₂ gas supply unit 47 starts the supply of the N₂ gas into the FOUP 30.

Figure 4A:
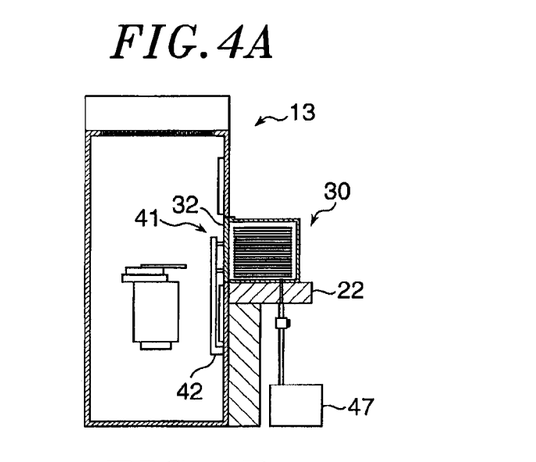
FIGS. 4A to 4C and 5A to 5C are flowcharts of a method for purging an inside of a container according to the embodiment.
Figure 4B:
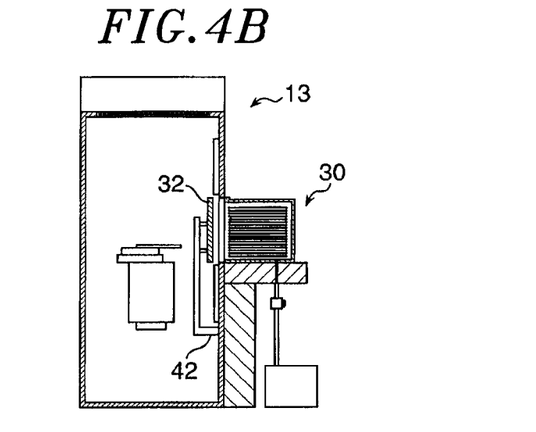
Figure 4C:
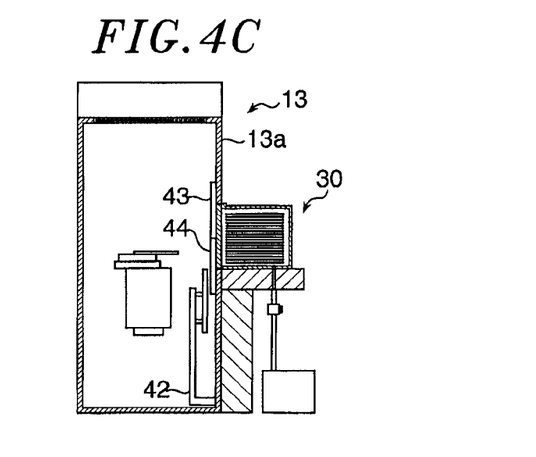

Next, the opener 42 is moved leftward in the drawing to remove the cover 32 from the FOUP 30 (see FIG. 4B). Accordingly, the inside of the FOUP 30 communicates with the inside of the loader module 13 through the opening 33.

Then, the opener 42 is moved downward, and the slide cover plates 43 and 44 move to the FOUP attachment opening 41 along the inner side of the side wall 13a. The slide cover plates 43 and 44 move toward each other until the gap therebetween becomes about 1 mm to 3 mm (see FIG. 4C). At this time, the opening 33 of the FOUP 30 is shielded from the inside of the loader module 13.

Next, when the plasma processing is performed on a single wafer W at a time in each of the process modules 12, the transfer unit 23 moves in a vertical direction so that the transfer arm 26 faces a processing target wafer W (a substrate to be unloaded) in the FOUP 30. At this time, the slide cover plates 43 and 44 are also moved along the inner side of the side wall 13a to form a substrate unloading gap 49 at a position corresponding to a position of the processing target wafer W (see FIG. 5A). The substrate unloading gap 49 is set to have a size of, e.g., about 20 mm to 50 mm, so that the pick P holding the wafer W and the arm members of the transfer arm 26 holding the pick P do not interfere with the slide cover plates 43 and 44. In the present embodiment, the N₂ gas supply unit 47 continues the supply of N₂ gas into the FOUP 30 while the substrate unloading gap 49 is formed by the separation of the slide cover plates 43 and 44.

Next, the transfer arm 26 unloads a processing target wafer W from the FOUP 30. The slide cover plates 43 and 44 move along the inner side of the side wall 13a to form the gap of about 1 mm to 3 mm therebetween. Accordingly, the opening 33 is shielded from the inside of the loader module 13 (see FIG. 5B).

Figure 5A:
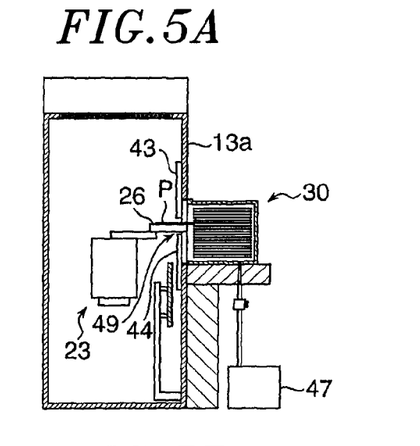
Figure 5B:
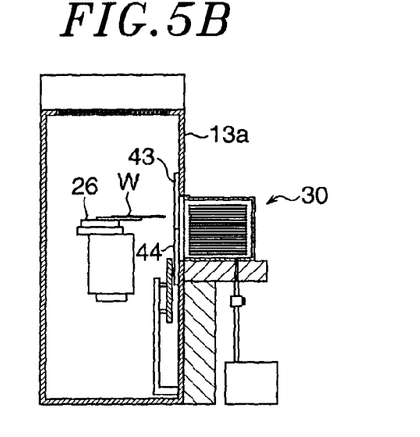
Figure 6:
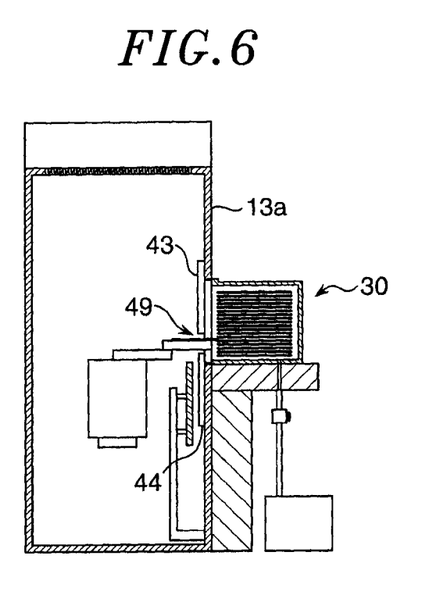
FIG. 6 shows a position where a substrate unloading gap is formed when a target wafer is changed.

Thereafter, all the wafers W accommodated in the FOUP 30 are sequentially subjected to the plasma processing by repeating the processes of FIGS. 5A and 5B. Whenever a processing target wafer W is changed, the slide cover plates 43 and 44 move along the inner side of the side wall 13a to form the substrate unloading gap 49 at a position corresponding to a position of a processing target wafer W to be unloaded (another substrate) (see FIG. 6).

When the wafer W subjected to the plasma processing needs to be returned to the FOUP 30, the slide cover plates 43 and 44 move along the inner side of the side wall 13a to form the substrate unloading gap 49 at a position corresponding to an accommodating position (one of the wafer teeth 34) of the wafer W subjected to the plasma processing in the FOUP 30, as described in the processes of FIGS. 5A and 5B. The transfer arm 26 returns the wafer W subjected to the plasma processing into the FOUP 30 through the substrate unloading gap 49.

After all the wafers W subjected to the plasma processing are accommodated in the FOUP 30, the slide cover plates 43 and 44 move along the inner side of the side wall 13a to retreat from the FOUP attachment opening 41. Then, the opener 42 is moved upward and rightward to fit the cover 32 into the opening 33 of the main body 31. Accordingly, the FOUP 30 is sealed (see FIG. 5C).

Figure 5C:
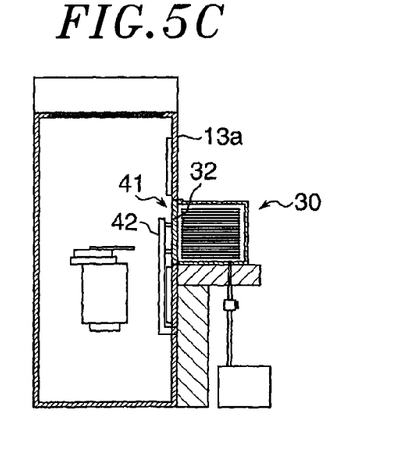

After the FOUP 30 is sealed, the N₂ gas supply unit 47 continues the supply of N₂ gas for a predetermined short period of time, e.g., about 60 sec. Next, the processing is completed.

In the method for purging the container according to the present embodiment, the slide cover plates 43 and 44 move along the opening surface of the opening 33 of the FOUP 30 which is attached to the loader module 13 and whose cover 32 is removed. Therefore, the opening 33 of the FOUP 30 can be shielded when the slide cover plates 43 and 44 move toward each other. Meanwhile, when a processing target wafer W is unloaded from the FOUP 30, the slide cover plates 43 and 44 are moved away from each other to form the substrate unloading gap 49 at a position corresponding to a position of a wafer W to be unloaded. Thus, the wafer W can be unloaded through the substrate unloading gap 49 without fully opening the opening 33. As a result, it is possible to prevent a large amount of $N_2$ gas supplied into the FOUP 30 from being leaked through the opening 33 and further possible to reduce the amount of $N_2$ gas used.

The method for purging the container according to the present embodiment can prevent a large amount of $N_2$ gas from being leaked and, thus, the concentration of $N_2$ gas in the FOUP 30 can be maintained easily. Accordingly, it is possible to complete, in a predetermined short period of time, e.g., about 60 sec, the supply of $N_2$ gas which is required to decrease the concentration of moisture in the FOUP 30 after all the wafers W subjected to the plasma processing are accommodated in the FOUP 30 and the cover 32 is fitted into the opening 33. As a result, the decrease of the throughput can be prevented.

In the method for purging the container according to the present embodiment, it is possible to prevent the acid gas from leaking into the loader module 13, because the generation of the acid gas as described above is suppressed. Therefore, it is unnecessary to perform a corrosion inhibiting coating process on components in the loader module 13. Further, since the acid gas is not carried by the downflow, it is unnecessary to provide a chemical filter that adsorbs acid at a path through which the downflow is discharged. Moreover, the clean room is not contaminated by the exhaust gas containing the acid gas.

In the method for purging the container according to the present embodiment, whenever a processing target wafer W is changed, the slide cover plates 43 and 44 move to form the substrate unloading gap 49 at a position corresponding to the accommodating position of the corresponding wafer W. Therefore, all the wafers W accommodated in the FOUP 30 can be unloaded without fully opening the opening 33.

Further, in the method for purging the container according to the present embodiment, $N_2$ gas is supplied into the FOUP 30 even while the substrate unloading gap 49 is being formed by the separation of the slide cover plates 43 and 44. Accordingly, the inside of the FOUP 30 can become clean and dry rapidly.

Figure 8:
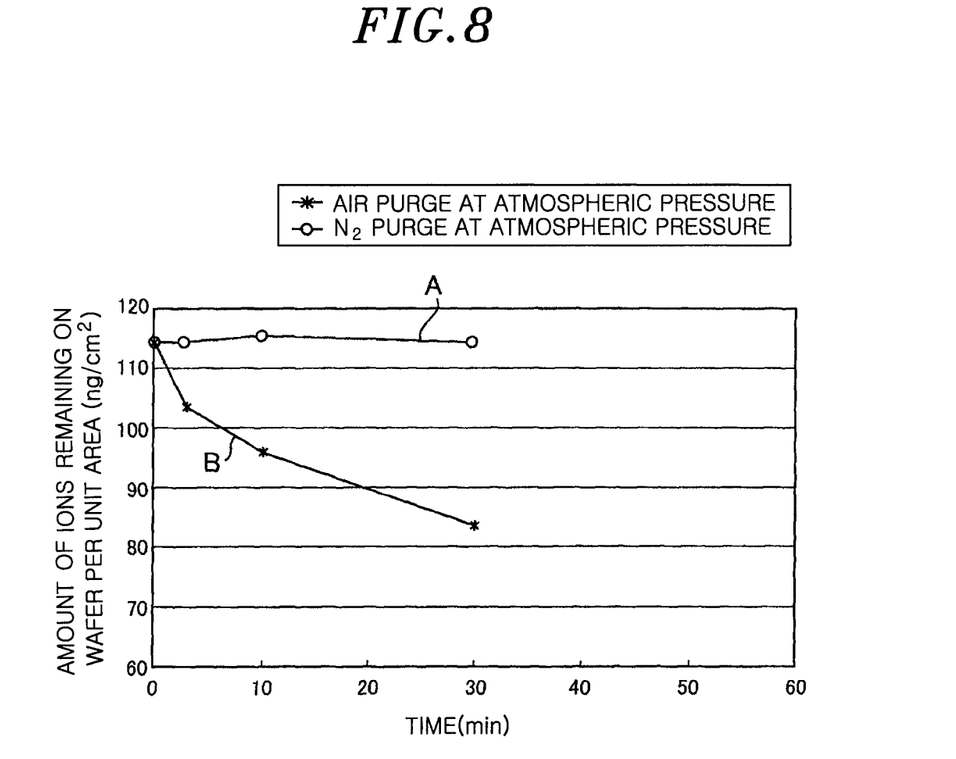
FIG. 8 is a graph showing temporal changes of the amount of ions remaining on a wafer which has been subjected to plasma processing and returned to the FOUP, in a purge process after the FOUP is sealed.

FIG. 8 is a graph showing temporal changes of the amount of ions remaining on the wafer, which has been subjected to the plasma processing and returned to the FOUP.

In the wafer W subjected to the plasma processing, ions are generated from a reaction by-product adhered to the wafer W. Therefore, the amount of residual ions represents indirectly the amount of reaction by-product. When the reaction by-product reacts directly or after volatilization with moisture remaining in the FOUP 30, the amount of the reaction by-product is reduced. The reduction in the amount of the residual ions indicates that an acid gas has been generated as a result of the chemical reaction between the reaction by-product and the moisture.

In the graph of FIG. 8, the state A shows the case of supplying $N_2$ gas into the FOUP 30 at an atmospheric pressure after sealing the FOUP 30, and the state B shows the case of supplying air into the FOUP 30 at an atmospheric pressure after sealing the FOUP 30.

As can be seen from the graph of FIG. 8, when air is supplied into the FOUP 30, moisture in the air chemically reacts with the reaction by-product adhered to the wafer W (the amount of residual ions is reduced). As a result, an acid gas is generated and may abnormally oxidize the wiring of the wafer W. On the other hand, when $N_2$ gas is supplied into the FOUP 30, air in the FOUP 30 is removed and no moisture exists. Thus, the reaction by-product adhered to the wafer W does not cause chemical reaction and an acid gas is not generated.

In other words, in the method for purging the container according to the present embodiment, the concentration of moisture in the FOUP 30 is maintained at a low level during the plasma processing for the wafer W by moving the slide cover plates 43 and 44 toward each other to shield the opening 33 of the FOUP 30. Accordingly, the reaction by-product adhered to the wafer W does not cause chemical reaction and an acid gas is not generated. As a result, the abnormal oxidation of the wiring of the wafer W can be suppressed.

While the present invention has been shown and described with respect to the embodiments, the present invention is not limited to the above-described embodiments.

Figure 7:
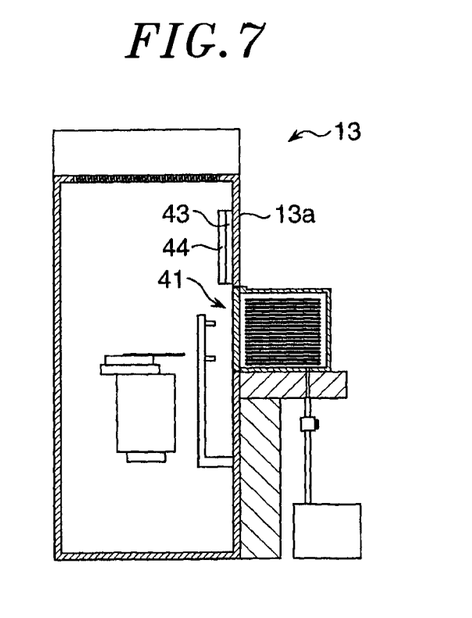
FIG. 7 is a cross sectional view schematically showing a configuration of a modification of the loader module shown in FIG. 1.

For example, the slide cover plates 43 and 44 are arranged above and below the FOUP attachment opening 41. However, the slide cover plates 43 and 44 may be overlapped and disposed only above the FOUP attachment opening 41 (see FIG. 7) or only below the FOUP attachment opening 41. In that case, when the slide cover plates 43 and 44 move respectively not to overlap, both of the slide cover plates 43 and 44 move along the inner side of the side wall 13*a* while keeping the fine gap with respect to the inner side of the side wall 13*a*.

Although the $N_2$ gas supply unit 47 supplies $N_2$ gas, another inert gas or dry gas may be supplied other than the $N_2$ gas.

This application claims priority to Japanese Patent Application No. 2012-256778 filed on Nov. 22, 2012, the entire contents of which are incorporated herein by reference.

DESCRIPTION OF REFERENCE NUMERALS

W: wafer
10: substrate processing apparatus
13: loader module
30: FOUP
31: main body
32: cover
33: opening
42: opener
43, 44: slide cover plate
47: $N_2$ gas supply unit
49: substrate unloading gap

What is claimed is:

1. A substrate processing apparatus configured to be coupled with a container configured to accommodate a plurality of substrates at a plurality of height positions and comprises an opening and a cover for blocking the opening, the substrate processing apparatus comprising:
   a substrate transfer chamber operable to be coupled with the container;
   a cover opening and closing mechanism configured to communicate an inside of the container with an inside of the substrate transfer chamber through the opening of the container by removing the cover of the container;
   a purge gas supply unit configured to supply a gas into the container; and a shielding mechanism configured to form a sealing to substantially isolate the inside of the container from the inside of the substrate transfer chamber, wherein the shielding mechanism comprises two slide cover plates respectively movable along an opening plane of the opening, wherein the two slide cover plates are both movable vertically and are operable to be respectively positioned above and below the opening of the container when the opening is fully opened, and wherein, when a substrate is to be unloaded from the container, the two slide cover plates are respectively moved to form a substrate unloading gap between the two slide cover plates, wherein the substrate uploading gap is located at a height position corresponding to a height position of the substrate to be unloaded without the opening being fully open.

2. A shielding device used in a substrate transfer chamber configured to be coupled to a container, wherein the container is configured to accommodate a plurality of substrates at a plurality of height positions and comprises an opening and a cover for blocking the opening, the shielding device comprising:

two slide cover plates both movable along an opening plane of the opening, wherein, when the shielding device is disposed in the substrate transfer chamber, the two slide cover plates are allowed to form a sealing gap to substantially isolate an inside of the container from an inside of the substrate transfer chamber after removing the cover of the container, wherein the two slide cover plates are respectively positioned above and below the opening when the opening is fully opened and configured to respectively movable in a vertical direction, and wherein, when a substrate is to be unloaded from the container, the two slide cover plates are moved to form a substrate unloading gap between the two slide cover plates, wherein the substrate unloading gap is positioned at a height position corresponding to a height position of the substrate to be unloaded without fully opening the opening.

3. The shielding device of claim 2, wherein the sealing gap is in the range of 1 mm to 3 mm.

4. The shielding mechanism of claim 2, wherein, when an inert gas or a dry gas is supplied into the container attached to the substrate transfer chamber, the two slide cover plates are placed to form the sealing gap to cause the inside of the container to be substantially isolated from the inside of the substrate transfer chamber.

5. A method for purging a container attached to a substrate transfer chamber, the container configured to accommodate a plurality of substrates disposed at a plurality of height positions and comprising an opening and a cover for blocking the opening, the method comprising:

communicating an inside of the container with an inside of the substrate transfer chamber by removing the cover of the container attached to the substrate transfer chamber;

supplying an inert gas or a dry gas into the container;

placing two slide cover plates, which are respectively movable along an opening plane of the opening, to form a sealing gap between the two slide cover plates to substantially isolate the inside of the container from the inside of the substrate transfer chamber;

moving the two slide cover plates respectively to form a substrate unloading gap between the two slide cover plates, wherein the substrate unloading gap is located at a height position corresponding to a height position of a substrate to be unloaded without fully opening the opening; and unloading the substrate from the container through the substrate unloading gap, wherein the two slide cover plates are respectively disposed above and below the opening when the opening is fully opened and configured to respectively movable in a vertical direction.

6. The method of claim 5, wherein the sealing gap is in the range of 1 mm to 3 mm.

7. The method of claim 6, wherein the substrate unloading gap is in the range of 20 mm to 50 mm.

8. The method of claim 7, further comprising:

when another substrate is to be unloaded from the container, moving the two slide cover plates respectively to form the substrate unloading gap at another height position corresponding to a height position of the another substrate to be unloaded.

9. The method of claim 8, wherein, while the two slide cover plates are moved, the inert gas or the dry gas is supplied into the container.

10. The method of claim 7, wherein the supplying the inert gas or the dry gas into the container is performed while the two slide cover plates are moved.

11. The method of claim 6, further comprising:

when another substrate is to be unloaded from the container, moving the two slide cover plates respectively to change the substrate unloading gap to another height position corresponding to a height position of the another substrate to be unloaded.

12. The method of claim 11, wherein, while the two slide cover plates are moved, the inert gas or the dry gas is supplied into the container.

13. The method of claim 6, wherein the supplying the inert gas or the dry gas into the container is performed while the two slide cover plates are moved.

14. The method of claim 5, wherein the substrate unloading gap is in the range of 20 mm to 50 mm.

15. The method of claim 14, further comprising:

when another substrate is to be unloaded from the container, moving the two slide cover plates respectively to change the substrate unloading gap to another height position corresponding to a height position of the another substrate to be unloaded.

16. The method of claim 15, wherein, while the two slide cover plates are moved, the inert gas or the dry gas is supplied into the container.

17. The method of claim 5, wherein the supplying the inert gas or the dry gas into the container is performed while the two slide cover plates are moved.

18. The method of claim 5, further comprising:

when another substrate is to be unloaded from the container, moving the two slide cover plates respectively to change the substrate unloading gap to another height position corresponding to a height position of the another substrate to be unloaded.

19. The method of claim 18, wherein, while the two slide cover plates are moved, the inert gas or the dry gas is supplied into the container.

20. The method of claim 5, wherein the supplying the inert gas or the dry gas into the container is performed while the two slide cover plates are moved.

21. The method of claim 5, further comprising:

processing an unloaded substrate; and loading a processed substrate into the container through the substrate unloading gap.

\* \* \* \* \*